United States Patent
Ferber et al.

(10) Patent No.: US 6,853,088 B2
(45) Date of Patent: Feb. 8, 2005

(54) SEMICONDUCTOR MODULE AND METHOD FOR FABRICATING THE SEMICONDUCTOR MODULE

(75) Inventors: Gottfried Ferber, Warstein (DE); Reimund Pelmer, Soest (DE)

(73) Assignee: EUPEC GmbH, Warstein (DE)

( * ) Notice: Subject to any disclaimer, the term of this patent is extended or adjusted under 35 U.S.C. 154(b) by 0 days.

(21) Appl. No.: 10/056,770

(22) Filed: Jan. 24, 2002

(65) Prior Publication Data

US 2002/0105075 A1 Aug. 8, 2002

(30) Foreign Application Priority Data

Jan. 24, 2001 (DE) ............................................ 101 03 084

(51) Int. Cl.[7] .............................................. H01L 23/48
(52) U.S. Cl. ...................... 257/782; 257/703; 257/705; 257/707
(58) Field of Search ................................ 257/700, 703, 257/705, 707, 782; 219/121.71; 438/125

(56) References Cited

U.S. PATENT DOCUMENTS

| | | | |
|---|---|---|---|
| 5,517,059 A | | 5/1996 | Eytcheson et al. |
| 5,629,559 A | * | 5/1997 | Miyahara .................... 257/666 |
| 5,721,044 A | * | 2/1998 | Schmidt et al. ............. 428/210 |
| 5,877,550 A | * | 3/1999 | Suzuki ........................ 257/700 |
| 5,938,952 A | | 8/1999 | Lin et al. |
| 6,020,629 A | * | 2/2000 | Farnworth et al. .......... 257/686 |

FOREIGN PATENT DOCUMENTS

| | | |
|---|---|---|
| DE | 42 39 598 A1 | 5/1993 |
| DE | 197 13 656 A1 | 10/1997 |
| JP | 03 044 954 A | 2/1991 |
| JP | 04 162 641 A | 6/1992 |
| JP | 06 254 690 A | 9/1994 |

OTHER PUBLICATIONS

Heinzelmann, E.: "Laserschweissen: Der Kniff mit dem Nachjustieren" (laser welding: the trick with the adjusting), TR Transfer, Nr. 17, 1995, pp. 16–19.

* cited by examiner

*Primary Examiner*—David Nelms
*Assistant Examiner*—Long Tran
(74) *Attorney, Agent, or Firm*—Laurence A. Greenberg; Werner H. Stemer; Gregory L. Mayback

(57) ABSTRACT

A semiconductor module and a method for its fabrication are described. The semiconductor module has at least one semiconductor component that is disposed directly on a substrate body. The substrate body has an insulating ceramic provided with a metal layer. At least one connection conductor is joined to the metal layer by welding, in particular laser microwelding.

8 Claims, 2 Drawing Sheets

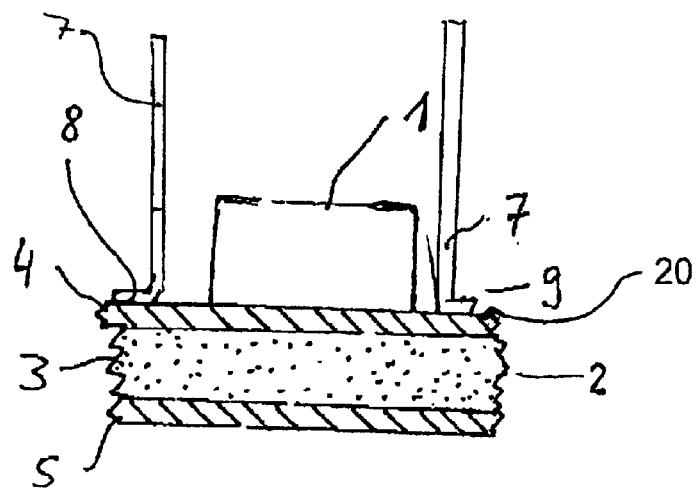
Fig 1
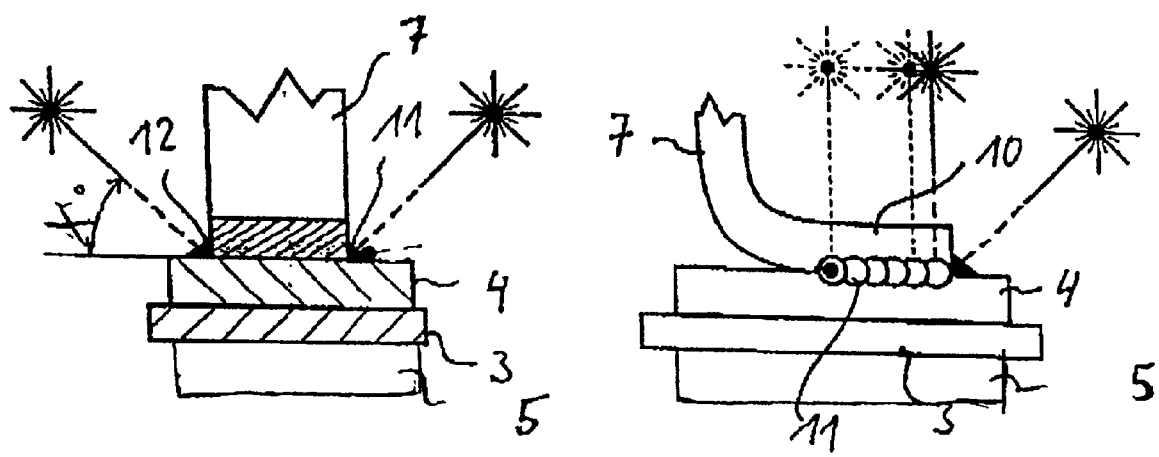
Fig. 2A
Fig. 2B

SEMICONDUCTOR MODULE AND METHOD FOR FABRICATING THE SEMICONDUCTOR MODULE

BACKGROUND OF THE INVENTION

Field of the Invention

In electrical and electronic appliances, the appropriate electronic circuits are usually constructed in modular form, i.e. from individual semiconductor components or groups of semiconductor components which are each disposed on a common substrate and can be prefabricated in order to simplify assembly of the appliance. In the event of damage, it is also easier to exchange modules than individual components or entire circuits.

A stable, reliable and inexpensive configuration is desired when building and configuring semiconductor modules of this type. Moreover, the smallest possible overall size of the modules is desired. In particular, the mechanical stability and the possibility of dissipating heat that is generated are also to be taken into account.

Insulating ceramics that, at least on their top side which faces the semiconductor components, have a metal layer which may, for example, be in the form of conductor tracks, are typically used as substrate bodies for the semiconductor modules of this type.

One problem with this is that of joining the connections to the metal layer of the substrate body in a manner that is as durable and stable as possible and has the best possible conductivity.

SUMMARY OF THE INVENTION

It is accordingly an object of the invention to provide a semiconductor module and a method for fabricating the semiconductor module which overcome the above-mentioned disadvantages of the prior art devices and methods of this general type, which has a secure connection to a metal layer of the substrate body and good electrical conductivity over a prolonged period.

With the foregoing and other objects in view there is provided, in accordance with the invention, a semiconductor module. The module includes a substrate body having an insulating ceramic layer with a top side, and a metal layer fixedly joined to the top side of the insulating ceramic layer. At least one semiconductor component is disposed directly on the substrate body facing the metal layer. The semiconductor component has at least one connection conductor joined to the metal layer by welding.

The invention relates to a semiconductor module having the semiconductor component which is disposed directly on the substrate body, which has an insulating ceramic and a metal layer which is disposed on the top side of the insulating ceramic, facing the semiconductor component, and is fixedly joined to the insulating ceramic.

According to the invention, the object is achieved by the fact that at least one connection conductor is joined to the metal layer by welding, in particular laser microwelding.

To join connection conductors to a metal layer of a substrate body based on an insulating ceramic, it has long been known to solder the connection conductors to the metal layer or to form the connection conductors as bonding wires which are joined to the metal layer by a bonding technique.

Use of the soldering technique results in a mechanically strong joint that is good at dissipating to the substrate body heat that is generated, for example, during the soldering operation. However, the soldered joint is vulnerable to fluctuating mechanical and thermal loads and can become detached over the course of time.

A joint produced by bonding is considerably more flexible and better able to withstand fluctuating loads than a soldered joint, but can make scarcely any contribution to the dissipation of heat from the semiconductor components.

A welded joint at this point has the advantage, first, of being very strong and able to withstand fluctuating loads, and second, partly on account of the nature of the joint between the connection conductor and the metal layer, of ensuring good heat transfer. An advantage in terms of production engineering is that there is no need for any additional material, for example in the form of solder, to be introduced while the connection conductor is being joined to the metal layer.

The use of the welding technique for the production of electrically conductive joints is known in principle, but the application of the technique within a semiconductor module on a substrate body is not known. Rather, the technique is only known for use on a larger scale on printed-circuit boards.

On account of the small overall size of the semiconductor modules, a very precise welding technique is required, as is provided, for example by laser microwelding. The laser microwelding operation can be fully automated for the production of semiconductor modules according to the invention.

An advantageous configuration of the invention provides for the insulating ceramic of the substrate body to contain $Al_2O_3$.

This ceramic is particularly inexpensive and has a good insulating performance and low thermal expansion, so that the mechanical loads that occur in the event of temperature fluctuations at the joints are kept at a low level. This also contributes to the stability of the welded joints.

A further advantageous configuration of the invention provides for the metal layer to contain copper and/or aluminium. This allows good heat transfer from the connection conductors to the substrate body and allows the production of a permanent welded joint.

It is particularly advantageous in this context for the substrate body to be configured as a DCB substrate or an active metallic brazed (AMB) substrate.

A direct copper bonded (DCB) substrate formed by bringing a copper foil provided with a thin layer of oxide into contact with an $Al_2O_3$ ceramic and heating it until a eutectic molten phase is formed at the interface between the copper and the ceramic, with the result that, after the composite body has been cooled, an intimate bond is formed between the copper layer and the ceramic.

This fixed joining has the effect of ensuring that the composite body overall has a coefficient of thermal expansion which is substantially equal to that of the ceramic.

Therefore, the overall result is a low thermal expansion in the event of temperature changes. Therefore, when a DCB substrate is being used, the mechanical loads on the connection between the metal layer and the connection conductors are kept at a particularly low level.

However, it is also advantageously possible for the insulating ceramic to formed of AlN or BeO.

In accordance with an added feature of the invention, the connection conductor is one of a plurality of connection conductors each formed of Cu, Al, CuSn and/or CnZn.

In accordance with another feature of the invention, a coating is disposed on the metal layer.

In accordance with an additional feature of the invention, the connection conductor has a foot that is bent at right angles.

In accordance with a further feature of the invention, the foot has at least one slot formed therein.

In accordance another further feature of the invention, the slot has a given width that is approximately equal to a thickness of the foot.

The invention also relates to a method for fabricating a semiconductor module having at least one semiconductor component which is disposed directly on a substrate body which has an insulating ceramic and a metal layer which is disposed on the top side of the insulating ceramic, facing the semiconductor component, and is fixedly joined to the insulating ceramic.

To achieve the object of creating a reliable and permanent connection between the connection conductors and the metal layer in as simple a manner as possible, it is provided, according to the invention, for at least one connection conductor to be joined to the metal layer by welding, in particular laser microwelding.

The method is simple and quick to carry out and can be fully automated. No further material has to be introduced as part of the joining operation. It is easy to monitor and control the quality of the joint.

It is advantageously possible for the connection conductor to be joined to the metal layer by successive spot welds.

Other features which are considered as characteristic for the invention are set forth in the appended claims.

Although the invention is illustrated and described herein as embodied in a semiconductor module and a method for fabricating the semiconductor module is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, cross-sectional view through part of a semiconductor module according to the invention;

FIG. 2A is a sectional view showing a welded joint between a connection conductor and a metal layer;

FIG. 2B is a side-elevational view showing the welded joint between the connection conductor and the metal layer;

DESCRIPTION OF THE PREFERRED EMBODIMENTS

Figure 3A:
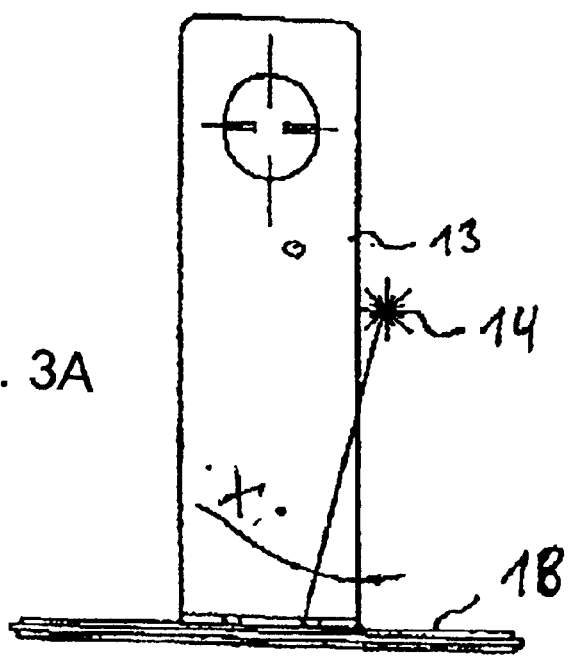
FIG. 3A is a front elevational view of a welded joint in a second embodiment of the invention.

In all the figures of the drawing, sub-features and integral parts that correspond to one another bear the same reference symbol in each case. Referring now to the figures of the drawing in detail and first, particularly, to FIG. 1 thereof, there is shown a structure of a semiconductor module with a semiconductor component 1, which is disposed directly on a substrate body 2. The substrate body 2 is configured as a direct copper bonded (DCB) body and contains an insulating ceramic 3 made from $Al_2O_3$, which on both sides bears a copper layer 4, 5, respectively, which is fixedly joined to the insulating ceramic 3.

The semiconductor component 1 may be directly adhesively bonded or soldered onto the metal layer 4. According to the invention, a connection conductor 7 is welded to the metal layer 4 by a microlaser in areas 8, 9.

On account of the fixed joining between the metal layers 4, 5 and the insulating ceramic 3, the DCB body is so mechanically stable, and is provided with such a low coefficient of thermal expansion, that the connection conductor 7 can be joined to the metal layer 4 by welding permanently and therefore it is able to withstand fluctuating loads.

FIGS. 2A and 2B show a more detailed illustration of the way in which the connection conductor 7 is secured and contact is made by laser microwelding.

FIG. 2A diagrammatically depicts the insulating ceramic 3 and the copper layer 4 in cross section, as well as an end of a connection conductor 7, which at its end facing the substrate body 2 is bent over in such a manner that its end 10 runs parallel to the surface of the copper layer 4 (see FIG. 2B).

At the joining edge which is formed between the end 10 of the connection conductor 7 and the copper layer 4, a spot-welded seam 11 is formed, by a plurality of successive spot welds, on one side of the connection conductor 7, and a further spot-welded seam 12 is formed on another side of the connection conductor 7, with the result that the connection conductor 7 is mechanically securely joined, in an electrically reliable manner, to the copper layer 4, with good thermal coupling also being ensured.

The spot-welded seam is produced by a microlaser, as indicated by various positions, which are in each case symbolically indicated by stars, of the microlaser and of the laser beam.

Figure 3B:
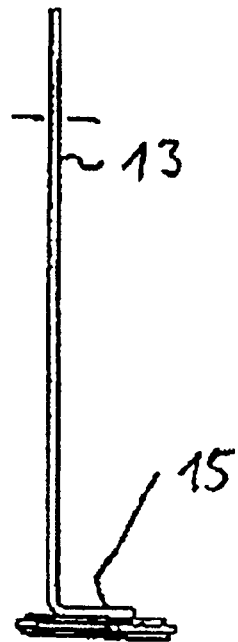
FIG. 3B is a side-elevational view of the welded joint.
Figure 3C:
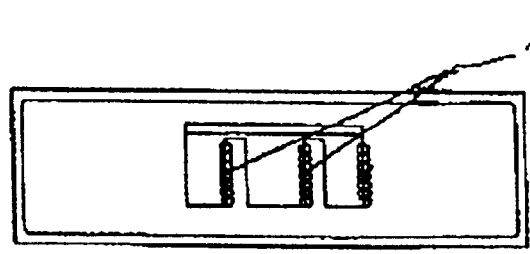
FIG. 3C is a plan view of a foot of a connection conductor.

FIGS. 3A–3C show a variant of the invention, in which the welding is carried out from only a single direction with respect to the connection conductor, by a laser 14. Therefore, during an automatic welding operation, the laser 14 can in principle remain at a single location or the work piece, in the form of the semiconductor module, does not have to be moved to a different side of the laser 14, or vice versa. The direction in which the laser 14 is disposed is diagrammatically indicated in FIG. 3A. To produce a multipart, reliable welded joint, it is merely necessary to change the angle of incidence of the laser 14 within tight limits.

In this connection, it is advantageous if a foot 15 of a connection conductor 13, which is bent off in particular at right angles, has one or more slots 16, 17, at which joined edges form between the foot 15 and a copper layer 18 of a substrate, which edges can be welded by spot-welded seams. The result is a sufficiently long welded seam to create a joint between the foot 15 of the connection conductor 13 and the copper layer 18 that is very good in terms of its mechanical, thermal and electrical properties.

The use of the described welding technique can be applied particularly advantageously for DCB substrates, but can conceivably also be applied for AlN substrates or for BeO substrates, each with a copper coating or a similar metal coating (e.g. aluminium).

Finally, it may also be advantageous for the connection conductors 7, 13 and the metal layer 4, 18 of the substrate body 2 to be coated with a metallic or non-metallic coating(s) 20, such as for example nickel, silver, tin, oxides and the like.

We claim:

1. A semiconductor module, comprising:

a substrate body having an insulating ceramic layer with a top side, and a metal layer fixedly joined to said top side of said insulating ceramic layer, said substrate body being one of a direct copper bonded (DCB) substrate and an active metallic brazed (AMB) substrate;

at least one connection conductor laser-welded to said metal layer, said connection conductor having a foot being bent at right angles, said foot having at least one slot formed therein; and at least one semiconductor component disposed directly on said substrate body facing said metal layer.

2. The semiconductor module according to claim 1, wherein said insulating ceramic layer of said substrate body is formed of $Al_2O_3$.

3. The semiconductor module according to claim 1, wherein said metal layer is formed of at least one material selected from the group consisting of copper and aluminium.

4. The semiconductor module according to claim 1, wherein said insulating ceramic layer contains AlN.

5. The semiconductor module according to claim 1, wherein said insulating ceramic layer contains BeO.

6. The semiconductor module according to claim 1, wherein said connection conductor is one of a plurality of connection conductors each formed of a at least one material selected from the group consisting of Cu, Al, CuSn and CnZn.

7. The semiconductor module according to claim 1, including a coating disposed on said metal layer.

8. The semiconductor module according to claim 1, wherein said slot has a given width that is approximately equal to a thickness of said foot.

* * * * *